(12) United States Patent
Holmes

(10) Patent No.: US 9,077,285 B2
(45) Date of Patent: Jul. 7, 2015

(54) ELECTRONIC DEVICES WITH MULTIPLE AMPLIFIER STAGES AND METHODS OF THEIR MANUFACTURE

(75) Inventor: Damon G. Holmes, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 88 days.

(21) Appl. No.: 13/441,217

(22) Filed: Apr. 6, 2012

(65) Prior Publication Data
US 2013/0265107 A1    Oct. 10, 2013

(51) Int. Cl.
| | |
|---|---|
| H03F 3/14 | (2006.01) |
| H03F 1/02 | (2006.01) |
| H03F 1/56 | (2006.01) |
| H03F 3/195 | (2006.01) |
| H03F 3/24 | (2006.01) |
| H01L 23/64 | (2006.01) |
| H01L 23/66 | (2006.01) |
| H01L 25/07 | (2006.01) |
| H01L 23/047 | (2006.01) |
| H01L 25/16 | (2006.01) |
| H01L 23/00 | (2006.01) |

(52) U.S. Cl.
CPC ............ *H03F 1/0288* (2013.01); *H03F 1/565* (2013.01); *H03F 3/195* (2013.01); *H03F 3/245* (2013.01); *H03F 2200/222* (2013.01); *H03F 2200/387* (2013.01); *H01L 23/047* (2013.01); *H01L 23/64* (2013.01); *H01L 23/66* (2013.01); *H01L 25/16* (2013.01); *H01L 2223/6655* (2013.01); *H01L 2224/48091* (2013.01); *H01L 2224/48137* (2013.01); *H01L 2224/4903* (2013.01); *H01L 2224/49175* (2013.01); *H01L 2924/30107* (2013.01); *H01L 2924/3011* (2013.01); *H01L 2924/00014* (2013.01); *H01L 24/48* (2013.01); *H01L 24/49* (2013.01); *H01L 25/072* (2013.01); *H01L 2223/6611* (2013.01)

(58) Field of Classification Search
USPC .............................. 330/124 R, 295, 302, 307
See application file for complete search history.

(56) References Cited

U.S. PATENT DOCUMENTS

| | | | |
|---|---|---|---|
| 6,060,951 A * | 5/2000 | Inoue ............................ 330/295 |
| 6,621,347 B2 * | 9/2003 | Morimoto et al. ............ 330/295 |
| 6,734,728 B1 * | 5/2004 | Leighton et al. .............. 330/307 |

(Continued)

OTHER PUBLICATIONS

Staudinger, J., et al., "High Efficiency 450W Asymmetric Three-Device Doherty Amplifier with Digital Feedback Predistortion," IEEE, RWS 2010, pp. 116-119.

(Continued)

*Primary Examiner* — Khanh V Nguyen
(74) *Attorney, Agent, or Firm* — Sherry W. Schumm

(57) ABSTRACT

An embodiment of an electrical device includes a device package and a plurality of amplifier paths physically contained by the device package. Each amplifier path includes an amplifier stage electrically coupled between an input and an output to the amplifier stage, and the amplifier stages of the plurality of amplifier paths are symmetrical. In a further embodiment, the amplifier paths have translational symmetry within the device package. In another further embodiment, transistors comprising the amplifier stages of the plurality of amplifier paths are substantially identical in size. The electrical device may be incorporated into an amplifier system that further includes an external input network and an external output network. For example, the amplifier system may be configured in a Doherty amplifier topology.

19 Claims, 5 Drawing Sheets

(56) References Cited

U.S. PATENT DOCUMENTS

| | | | |
|---|---|---|---|
| 6,798,295 B2 * | 9/2004 | Pengelly et al. | 330/295 |
| 6,833,761 B2 * | 12/2004 | Staudinger et al. | 330/307 |
| 7,078,976 B2 | 7/2006 | Blednov | |
| 7,193,472 B2 * | 3/2007 | Gotou et al. | 330/295 |
| 7,310,019 B2 * | 12/2007 | Gotou et al. | 330/295 |
| 7,400,199 B2 * | 7/2008 | Kawashima et al. | 330/295 |
| 7,477,108 B2 * | 1/2009 | Ichitsubo et al. | 330/295 |
| 7,659,927 B2 | 2/2010 | Aizawa et al. | |
| 8,022,760 B2 | 9/2011 | Gajadharsing et al. | |
| 8,274,332 B2 * | 9/2012 | Cho et al. | 330/295 |
| 2009/0039966 A1 * | 2/2009 | Chow et al. | 330/307 |
| 2010/0315162 A1 | 12/2010 | Gajadharsing et al. | |
| 2012/0092076 A1 * | 4/2012 | Kamgaing et al. | 330/302 |
| 2012/0268211 A1 * | 10/2012 | Ng et al. | 330/307 |

OTHER PUBLICATIONS

International Application No. PCT/IB2011/001049, "Efficiency Enhancement Method for a Doherty Amplifier (Hybrid)", Basim H. Noori, et al, Filed Apr. 20, 2011.

* cited by examiner

US 9,077,285 B2

ELECTRONIC DEVICES WITH MULTIPLE AMPLIFIER STAGES AND METHODS OF THEIR MANUFACTURE

TECHNICAL FIELD

Embodiments of the subject matter described herein relate generally to electronic devices, and more particularly, embodiments of the subject matter relate to amplifiers with multiple amplifier stages (e.g., Doherty amplifiers) and methods of manufacturing electronic devices that include such multiple-stage amplifiers.

BACKGROUND

Doherty amplifiers are commonly used to amplify signals in systems that require the efficient conversion of direct current (DC) power to modulated radio frequency (RF) power. For example, in cellular and other RF applications, base stations or other infrastructure components employ Doherty amplifiers to broadcast signals over great distances.

A typical Doherty amplifier topology includes multiple amplifier stages that operate in parallel to supply current to a load (e.g., an antenna). For example, a two-stage Doherty amplifier includes a main amplifier stage and a peaking amplifier stage. At input power levels below the threshold of the peaking amplifier stage, only the main amplifier stage provides current to the load. At input power levels exceeding the threshold of the peaking amplifier stage, currents output from both the main and peaking amplifier stages are summed in-phase to provide current to the load. More specifically, the peaking amplifier stage is biased to turn on when the input signal increases above a level that would cause the main amplifier stage to saturate. An output impedance network coupled to the outputs of the main and peaking amplifier stages is configured so that the apparent impedance seen by the main amplifier stage decreases when the peaking amplifier stage is producing current. This enables the main amplifier stage to deliver more current in conjunction with the current delivered by the peaking amplifier stage.

To ensure that the currents from the main and peaking amplifiers are summed in-phase, some Doherty amplifiers also include an input impedance network configured to apply a phase shift to the input signal supplied to the peaking amplifier stage. In a particular topology, at the input to the Doherty amplifier, the input signal is split into two channels, and a phase shift (typically a quarter wave) is applied to the signal carried on the channel corresponding to the peaking amplifier stage. The output impedance network aligns the phases of the output signals produced by the main and peaking amplifier stages by applying a similar phase shift to the output of the main amplifier stage prior to summing the outputs of the main and peaking amplifier stages.

To achieve desired performance of a Doherty amplifier, the main and peaking amplifier stages are designed asymmetrically. More particularly, the transistor associated with the peaking amplifier stage typically is larger (e.g., twice as large) as the transistor associated with the main amplifier stage. Accordingly, producing a Doherty amplifier design typically involves twice the design effort than is required to design an amplifier with a single transistor or with matched transistors. In addition, many current Doherty amplifier designs suffer from relatively poor DC-to-RF conversion efficiency and signal quality, and/or relatively large design footprints.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Embodiments of the subject matter described herein relate to electronic devices suitable for use with various amplifier system topologies (e.g., Doherty amplifier topologies), and methods for manufacturing such electronic devices. More specifically, an embodiment of an electronic device includes a plurality of amplifier paths contained within a single package, where the amplifier stages of each of the plurality of amplifier paths is symmetrical (e.g., substantially identical). In a particular embodiment, the plurality of amplifier paths includes three amplifier paths, and the electronic device may be implemented in a Doherty amplifier topology.

Figure 1:
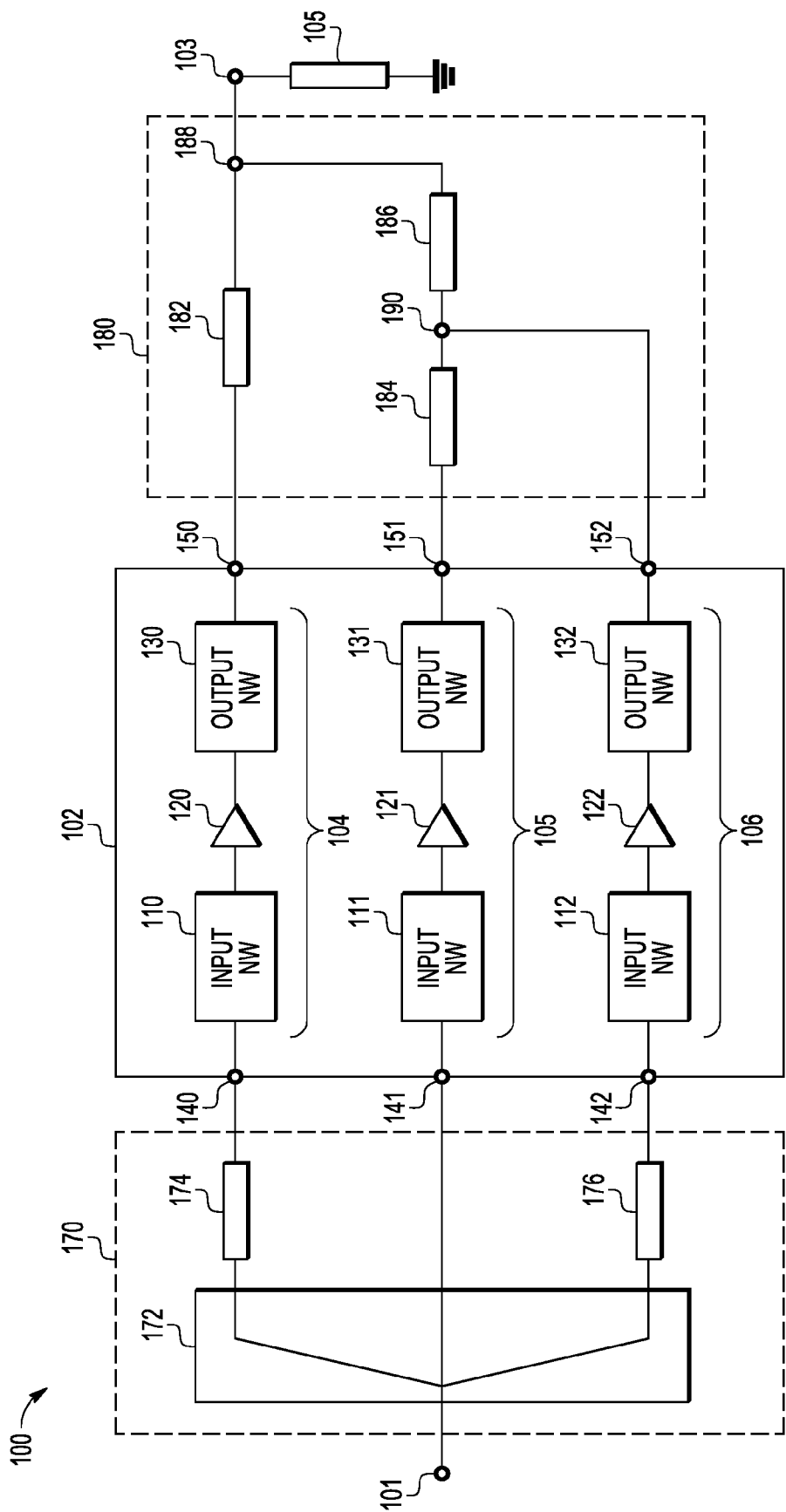
FIG. 1 is a block diagram of an amplifier system, in accordance with an example embodiment.

FIG. 1 depicts an exemplary embodiment of an amplifier system 100 including, without limitation, an input node 101, an output node 103, an electronic device 102, an external input network 170, and an external output network 180, according to an embodiment. The external input network 170 is coupled between input node 101 and input terminals 140, 141, 142 to the electronic device 102, and the external output network 180 is coupled between output terminals 150, 151, 152 of the electronic device 102 and output node 103. An input signal received at input node 101 is amplified by amplifier system 100 and provided to a load 105 (e.g., an antenna) via output node 103. As will be described in more detail below, the amplifier system 100 is configured in a Doherty amplifier topology.

The electronic device 102 includes multiple amplifier paths 104, 105, 106, where each amplifier path 104-106 includes an input impedance matching network (NW) 110, 111, 112, an amplifier stage 120, 121, 122, and an output impedance matching network (NW) 130, 131, 132 coupled in series between input terminals 140-142 and output terminals 150-152 of the device 102. More specifically, a first amplifier path 104 includes input impedance matching network 110 coupled between input terminal 140 and the input of amplifier stage 120, and output impedance matching network 130 coupled between the output of amplifier stage 120 and output terminal 150. A second amplifier path 105 includes input impedance matching network 111 coupled between input terminal 141 and the input of amplifier stage 121, and output impedance matching network 131 coupled between the output of amplifier stage 121 and output terminal 151. Finally, a third amplifier path 106 includes input impedance matching network 112 coupled between input terminal 142 and the input of amplifier stage 122, and output impedance matching network 132 coupled between the output of amplifier stage 122 and output terminal 152. In an alternate embodiment, each amplifier path 104-106 may exclude either or both the input impedance matching networks 110-112 and/or the output impedance matching network 130-132. In such embodiments, each amplifier path 104-106 may essentially include only an amplifier stage 120-122, or each amplifier path 104-106 may include an amplifier stage 120-122 and either an input impedance matching network 110-112 or an output impedance matching network 130-132, but not both. Further, in such embodiments, the various phase shifts applied by the input and/or output impedance matching networks 110-112, 130-132 may (or may not) be incorporated into the external input network 170 and/or the external output network 180, respectively. Although electronic device 102 is shown to include three amplifier paths 104-106, other embodiments of electronic devices that are suitable for use in accordance with the inventive subject matter may include more than three amplifier paths.

Figure 2:
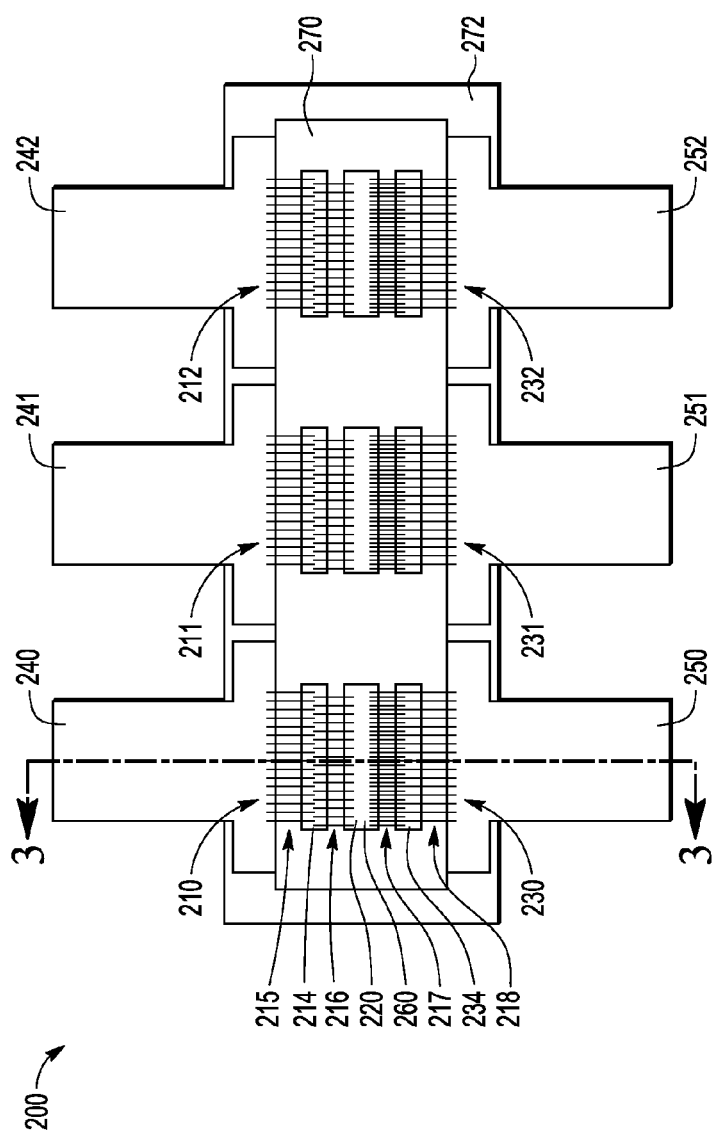
FIG. 2 is a top view of an electronic device, in accordance with an example embodiment.
Figure 3:
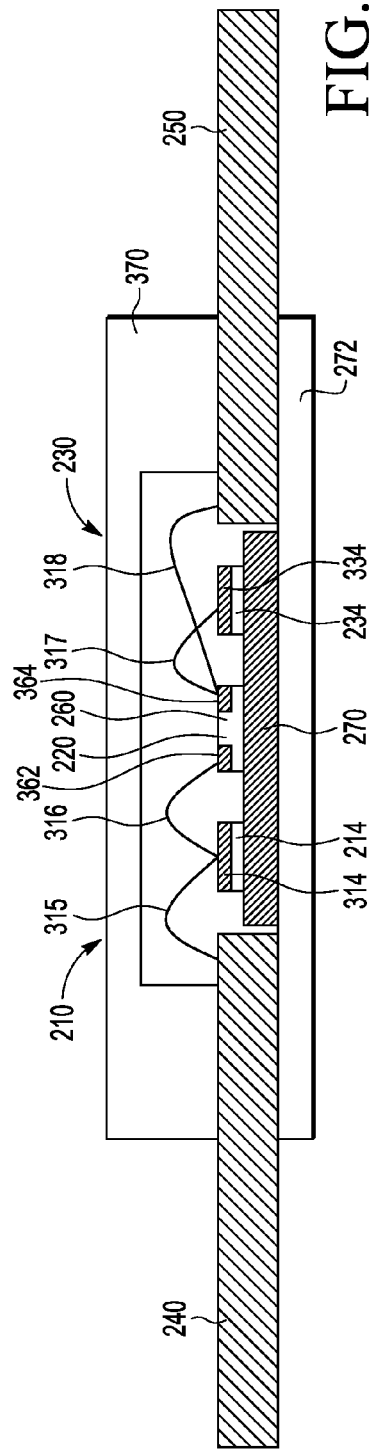
FIG. 3 is a cross-sectional side view of the electronic device of FIG. 2 along lines 3-3, in accordance with an example embodiment.
Figure 4:
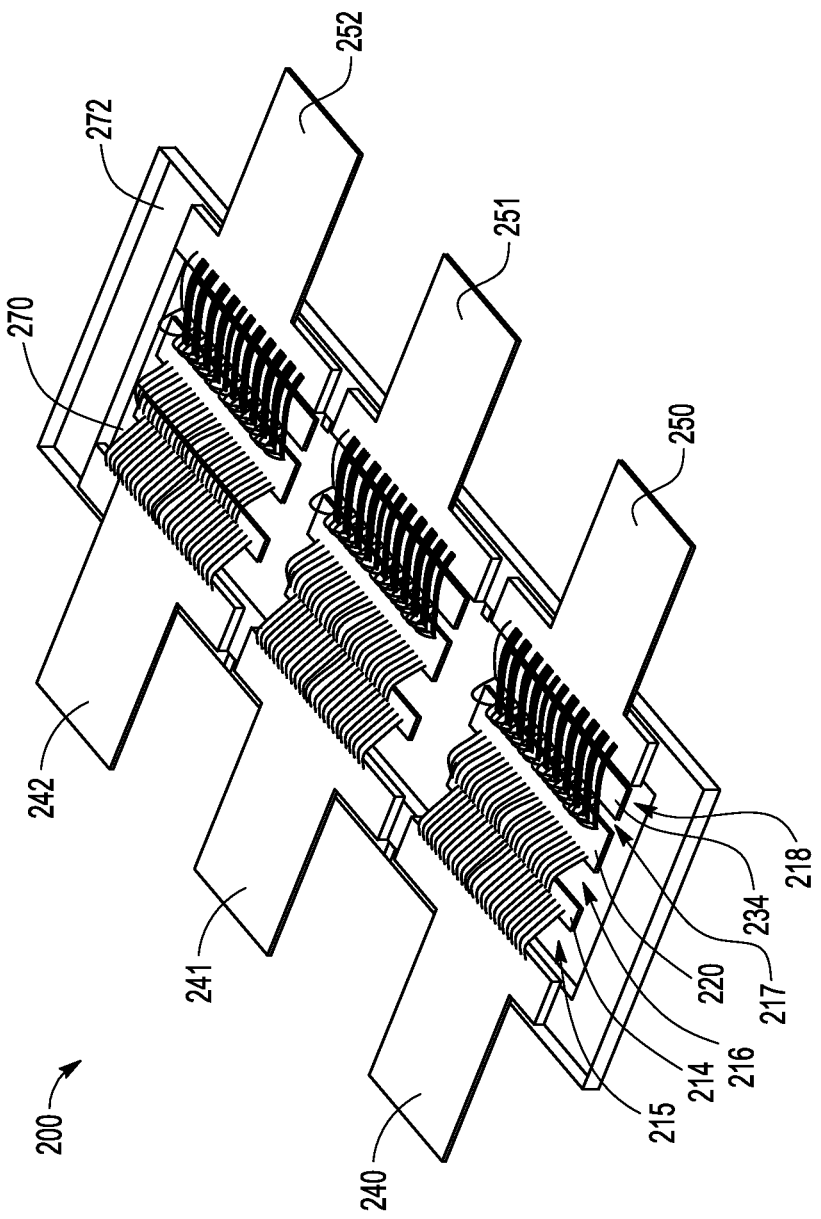
FIG. 4 is a three-dimensional view of the electronic device of FIG. 2, in accordance with an example embodiment.

The amplifier stages 120-122 in electronic device 102 each may be fabricated on separate die (e.g., as illustrated in FIGS. 2-4), or the amplifier stages 120-122 may be fabricated on the same die. Each of the amplifier stages 120-122 includes an arrangement of one or more transistors. According to an embodiment, the amplifier stages 120-122 are symmetrical, meaning that the transistor(s) (or die) comprising each of the amplifier stages 120-122 are identical in size or "substantially identical" in size (i.e., less than about 5% different in any one or more dimensions). More specifically, the size and device width of the transistor(s) (or die) for the amplifier stages 120-122 (e.g., the source-to-drain pitch, the gate width, and the like) are identical or substantially identical for each of the amplifier stages 120-122. Further, the transistor(s) (or die) comprising each of amplifier stages 120-122 are fabricated using the same specific parameters (e.g., source-to-drain pitch, doping levels, the type of semiconductor material used for die 400, and the like) and fabrication technology (e.g., gallium nitride transistor technology or silicon-based transistor technology). Accordingly, the transistor(s) (or die) comprising each of amplifier stages 120-122 have a symmetrical power ratio of 1:1:1 (or a "substantially symmetrical power ratio," meaning that the power ratio between any set of the amplifier stages 120-122 is between 1:1 and 1:1.05), allowing for symmetric Doherty operation. This is in contrast with a typical Doherty amplifier configuration, in which the transistor(s) (or die) for the main amplifier is sized independently from the transistor(s) (or die) for the peaking amplifier(s) to accommodate different power ratios between the main and peaking amplifier(s) (e.g., power ratios typically on the order of 1:2 or more).

Due to the symmetry of the amplifier stages 120-122, any one of the amplifier stages 120-122 may be considered to be the main amplifier, with the other amplifier stages 120-122 being considered to be peaking amplifiers. The designation of one amplifier or another as a main or peaking amplifier may depend on the configuration of the external input and output networks (e.g., input and output networks 170, 180) to which the electronic device 102 is connected. For example, when incorporated into the Doherty amplifier configuration shown in FIG. 1, amplifier stage 120 may be considered to be a main amplifier, and amplifier stages 121, 122 may be considered to be first and second peaking amplifiers. For convenience of description, this designation will be used throughout this description, although it is to be understood that any of amplifier stages 120-122 may be the main amplifier, and the other of amplifier stages 120-122 may be the peaking amplifiers. In any event, the main amplifier stage 120 is configured as a Class AB amplifier, meaning that the transistor arrangement of main amplifier stage 120 is biased to provide a conduction angle between 180 and 360 degrees. Conversely, each of the peaking amplifier stages 121, 122 are realized as a transistor arrangement configured as a Class C amplifier, meaning that the transistor arrangement of each of the peaking amplifier stages 121, 122 is biased to provide a conduction angle less than 180 degrees. Alternatively, the peaking amplifier stages 121 and 122 may be connected to external control circuitry that dynamically adjusts the peaking amplifier's operating mode between Class AB and Class C at the RF signal's envelope rate depending on instantaneous output power requirements.

Along with each of the amplifier stages 120-122 being substantially identical, each of the multiple amplifier paths 104-106 are substantially identical, according to an embodiment. More specifically, the input impedance matching networks 110-112 are substantially identical to each other, and the output impedance matching networks 130-132 also are substantially identical to each other. In such an embodiment, the multiple amplifier paths 104-106 also may be considered to be symmetrical with each other. In other embodiments, the input impedance matching networks 110-112 may be different from each other, and/or the output impedance matching networks 130-132 may be different from each other.

Each of the input impedance matching networks 110-112 is configured to provide a desired input impedance at its respective input terminal 140-142 at the fundamental frequency (or carrier frequency) of the amplifier system 100. For example, for a fundamental frequency of about 1.8 GHz to about 2.2 GHz, each input impedance matching network 110-112 provides an input impedance at an input 140-142 of the electronic device 102 within the range of about one to five ohms. However, the input impedance at the inputs 140-142 may vary to suit the needs of a particular embodiment. Similarly, each of the output impedance matching networks 130-132 is configured to provide a desired output impedance at its respective output terminal 150-152 at the fundamental frequency of the amplifier system 100. In an exemplary embodiment, the amplifier system 100 is used to transmit RF signals, and the fundamental frequency (or carrier frequency) is the frequency of transmittance.

It should be noted that the subject matter described herein is not intended to be limited to any particular configuration and/or circuit topology for the input impedance matching networks 110-112 and the output impedance matching networks 130-132. That being said, in an embodiment, some or all of the input impedance matching networks 110-112 are realized as a low-pass impedance matching circuit topology (e.g., a shunt capacitance impedance matching circuit topology, as will be discussed in more detail in conjunction with FIGS. 5 and 6). For example, an input impedance matching network 110-112 configured in such a manner may provide a phase inversion (e.g., a 180° phase shift) that results in the phase of the signal at the input of the amplifier 110-112 being shifted 180° relative to the signal at the input terminal 140-142. In alternate embodiments, some or all of the input impedance matching networks 110-112 are realized as a high-pass impedance matching circuit topology. For example, an input impedance matching network 110-112 configured in such a manner may provide a single phase inversion (e.g., a 90° phase shift) that results in the phase of the signal at the input of the amplifier 110-112 being shifted 90° relative to the signal at the input terminal 140-142.

In an embodiment, some or all of the output impedance matching networks 130-132 are realized as a high-pass impedance matching circuit topology (e.g., as will be discussed in more detail in conjunction with FIG. 5), in an embodiment. For example, an output impedance matching network 130-132 configured in such a manner may provide a quarterwave shift (e.g., a 90° phase shift) that results in the phase of the signal at the output terminal 150-152 being shifted 90° relative to the signal at the output of the amplifier 110-112. In an alternate embodiment, some or all of the output impedance matching networks 130-132 are realized as a low-pass impedance matching circuit topology (e.g., as will be discussed in more detail in conjunction with FIG. 6). For example, an output impedance matching network 130-132 configured in such a manner may provide a phase inversion (e.g., a 180° phase shift) that results in the phase of the signal at the output terminal 150-152 being shifted 180° relative to the signal at the output of the amplifier 110-112.

According to an embodiment, the multiple amplifier paths 104-106 all are contained in a single device package 160 with the input and output terminals 140-142, 150-152 providing external electronic connectivity to the device 102. More specifically, the input and output terminals 140-142, 150-152 generally represent the package leads, pins, or other physical interfaces for creating electrical connections to the internal components (e.g., amplifier paths 104-106) of the electronic device 102. For example, the device package 160 may include a package substrate (e.g., package substrate 272, FIG. 2) and encapsulation or a cap (e.g., cap 370, FIG. 3), which physically houses all of the amplifier paths 104-106 and from which the input and output terminals 140-142, 150-152 extend to provide the external electronic connectivity. More specifically, in an embodiment in which three amplifier paths 104-106 are implemented, three input terminals 140-142 and three output terminals 150-152 may extend from the package substrate and encapsulation to provide the external electronic connectivity (e.g., as shown in FIGS. 2-4).

In the illustrated embodiment of FIG. 1, the amplifier system 100 is configured for a Doherty amplifier implementation. In this regard, the external input network 170 includes a power splitter (or power divider) 172 configured to divide the input power of the input signal received at node 101 into multiple portions (e.g., equal portions) of the input signal, where respective portions of the input signal are provided to input terminals 140-142. For example, a first output of the power splitter 172 may be coupled to the input terminal 140 corresponding to the first amplifier path 104, a second output of the power splitter 172 may be coupled to the input terminal 141 corresponding to the second amplifier path 105, and a third output of the power splitter 172 may be coupled to the input terminal 142 corresponding to the third amplifier path 106. The power splitter 172 may divide the input power equally among the amplifier paths 104-106, such that roughly 33⅓ percent of the input signal power is provided to each amplifier path 104-106.

According to an embodiment, the external input network 170 also includes a first phase inversion element 174 between a first output of the power splitter 172 and the input terminal 140 corresponding to the first amplifier path 104, and a second phase inversion element 176 between a third output of the power splitter 172 and the input terminal 142 corresponding to the third amplifier path 106. For example, each of the first and second phase inversion elements 174, 176 may be implemented as a quarter wave transmission transformer (e.g., a 90° phase length transmission line) or a lumped element implementation of a 90° phase transformer, in various embodiments.

According to an embodiment, the external output network 180 includes a third phase inversion element 182 between the output terminal 150 corresponding to the first amplifier path 104 and a summing node 188, a fourth phase inversion element 184 between the output terminal 151 corresponding to the second amplifier path 105 and a summing node 190, and a fifth phase inversion element 186 between the summing node 190 and the summing node 188. The output terminal 152 corresponding to the third amplifier path 106 also is coupled to summing node 190. As with the first and second phase inversion elements 174, 176, the third, fourth, and fifth phase inversion elements 182, 184, 186 each may be implemented as a quarter wave transmission transformer (e.g., a 90° phase length transmission line) or a lumped element implementation of a 90° phase transformer, in various embodiments. The combination of phase inversion elements 174, 176, 182, 184, 186 in the external input and output networks 170, 180 ensures that the currents ultimately provided to summing node 188 by the respective amplifier paths 104-106 are provided in-phase with each other. Accordingly, the current provided by summing node 188 to output node 103 (and to load 105) represent the in-phase summation of the currents provided by amplifier paths 104-106.

It should be understood that FIG. 1 is a simplified representation of an amplifier system 100 for purposes of explanation and ease of description, and that practical embodiments may include other devices and components to provide additional functions and features, and/or the amplifier system 100 may be part of a much larger electrical system, as will be understood. Thus, although FIG. 1 depicts direct electrical connections between circuit elements and/or terminals, alternative embodiments may employ intervening circuit elements and/or components while functioning in a substantially similar manner.

FIGS. 2-4 depict top, cross-sectional (along lines 3-3 of FIG. 2), and three-dimensional views, respectively, of an exemplary embodiment of an electronic device 200 suitable for use as the electronic device 102 in the amplifier system 100 of FIG. 1. As described above, the electronic device 200 includes a plurality of amplifier paths, and the plurality of amplifier paths are all contained within a single device package. According to an embodiment, the plurality of amplifier paths include three amplifier paths, or more specifically first, second, and third amplifier stages 220, 221, 222 (e.g., amplifier stages 120-122, FIG. 1), first, second, and third input impedance matching networks 210, 211, 212 (e.g., input impedance matching networks 110-112, FIG. 1), and first, second, and third output impedance matching networks 230, 231, 232 (e.g., output impedance matching networks 130-132, FIG. 1). As shown in FIG. 2, the amplifier paths have "translational symmetry" within the device package, meaning that the amplifier paths are duplicates of each other, and the duplicate amplifier paths are physically disposed in parallel with but offset from each other within the device package.

Each input impedance matching network 210-212 is coupled between an input package lead 220, 221, 222 (corresponding to input terminals 140-142, FIG. 1) and an input to an amplifier stage 220-222 for a given amplifier path. Each output impedance matching network 230-232 is coupled between an output to an amplifier stage 220-222 for a given amplifier path and an output package lead 250, 251, 252 (corresponding to output terminals 150-152, FIG. 1). Each interconnected arrangement of an input package lead 240-242, an input impedance matching network 210-212, an amplifier stage 220-222, an output impedance matching network 230-232, and an output package lead 250-252 corresponds to an amplifier path (e.g., one of amplifier paths 104-106, FIG. 1). For example, FIG. 3 illustrates a cross-sectional view of a single amplifier path (e.g., amplifier path 104, FIG. 1), according to an exemplary embodiment. The elements of the electronic device 200 are similar to their counterpart elements described above in the context of FIG. 1, and accordingly, such common aspects will not be redundantly described here in the context of FIGS. 2-4.

Each of amplifier stages 220-222 is realized as a transistor arrangement (e.g., one or more transistors). According to an embodiment, each amplifier stage 220-222 is formed on a separate, substantially identical die block or amplifier substrate 260, 261, 262 (e.g., a semiconductor substrate or die). In an alternate embodiment, each amplifier stage 220-222 may be formed on multiple die blocks or amplifier substrates. In another alternate embodiment, the multiple amplifier stages 220-222 may be formed on a single die block or amplifier substrate. In the former embodiment, as is illustrated in FIG. 2, amplifier stages 220-222 each are formed on an amplifier substrate 260-262 that is mounted or affixed to a conductive (e.g., metal) substrate 270 (e.g., copper or the like) that provides an electrical ground reference voltage for the electronic device 200.

The conductive substrate 270, input package leads 240-242, and output package leads 250-252 are, in turn, mounted on and structurally supported by package substrate 272. Conductive substrate 270 functions as the primary mounting structure for electronic device 200, such that various components of the electronic device 200 (e.g., input impedance matching networks 210-212, amplifier stages 220-222, and output impedance matching networks 230-232) are mounted or affixed to various areas of the conductive substrate 270, as described in greater detail below.

Referring also to FIG. 3, in an exemplary embodiment, each amplifier substrate 260-262 includes gate and drain contact regions 362, 364 on or in proximity to the top of each amplifier substrate 260-262. In this regard, an input signal may be provided to a terminal (e.g., the gate terminal) of each amplifier stage 220-222 via the gate contact region 362, and the amplified signal generated by each amplifier stage 220-222 and present at a terminal (e.g., the drain terminal) of each amplifier stage 220-222 may be accessed via the drain contact region 364. A source contact region (not illustrated) may be present on or in proximity to the bottom of each amplifier substrate 260-262, and the source contact region may be coupled to the conductive substrate 270, in order to ground the source terminal of each amplifier stage 220-222.

According to an embodiment, each input impedance matching network 210, 211, 212 (e.g., input impedance matching networks 110-112, FIG. 1) may be realized as an arrangement of inductive and capacitive elements. For example, input impedance matching network 210 may include one or more discrete capacitors 214, and first and second wirebond arrays 215, 216, where each wirebond array 215, 216 corresponds to an inductive element. Input impedance matching networks 211, 212 may be similarly arranged. Output impedance matching networks 230, 231, 232 (e.g., output impedance matching networks 130-132, FIG. 1) also may be realized as an arrangement of inductive and capacitive elements. For example, output impedance matching network 230 may include one or more discrete capacitors 234, and third and fourth wirebond arrays 217, 218, where each wirebond array 217, 218 corresponds to an inductive element. Output impedance matching networks 231, 232 may be similarly arranged. In an embodiment, capacitors 214, 234 may be realized as metal-oxide-semiconductor (MOS) capacitors. In other embodiments, capacitors 214, 234 may be realized using other suitable capacitor structures.

Figure 5:
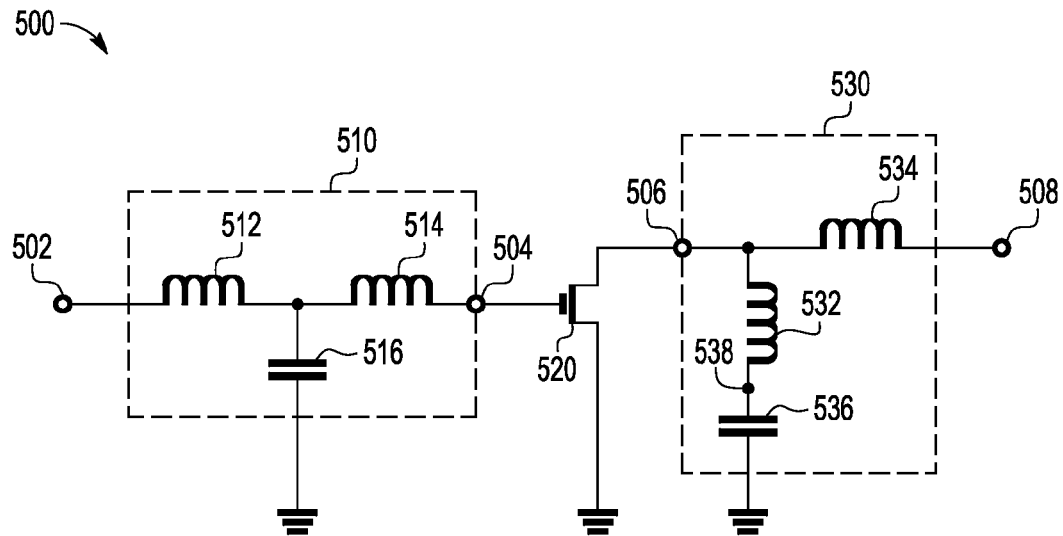
FIG. 5 is a circuit diagram of an amplifier path, in accordance with an example embodiment.

The first wirebond array 215 may correspond to a first inductive element (e.g., inductive element 512, 612, FIGS. 5, 6), the second wirebond array 216 may correspond to a second inductive element (e.g., inductive element 514, 614, FIGS. 5, 6), the third wirebond array 217 may correspond to a third inductive element (e.g., inductive element 532, FIG. 5), and the fourth wirebond array 218 may correspond to a fourth inductive element (e.g., inductive element 534, FIG. 5). The numbers, shapes, and/or lengths of the wirebonds of each wirebond array 215-218 are chosen to provide a desired inductance for each of the various inductive elements. As illustrated in FIG. 2, the lengths of the wirebonds of each wirebond array 215-218 are aligned substantially parallel to one another.

As shown more clearly in FIG. 3, which depicts wirebonds 315, 316, 317, 318 associated with each of the first, second, third, and fourth wirebond arrays 215-218, each wirebond 315-318 electrically interconnects various components of the system 200. For example, a first wirebond 315 (and the other wirebonds associated with the first wirebond array 215) has a first end that is soldered, bonded, affixed, or otherwise electrically connected to input package lead 240, and an opposing end that is soldered, bonded, affixed, or otherwise electrically connected to a first terminal 314 of capacitor 214. A second wirebond 316 (and the other wirebonds associated with the second wirebond array 216) has a first end that is soldered, bonded, affixed, or otherwise electrically connected to the first terminal 314 of capacitor 214, and an opposing end that is soldered, bonded, affixed, or otherwise electrically connected to the gate contact region 362 of amplifier stage 220. A third wirebond 317 (and the other wirebonds associated with the third wirebond array 217) has a first end that is soldered, bonded, affixed, or otherwise electrically connected to the drain terminal 364 of amplifier stage 220, and an opposing end that is soldered, bonded, affixed, or otherwise electrically connected to the first terminal 334 of capacitor 234. A fourth wirebond 318 (and the other wirebonds associated with the fourth wirebond array 218) has a first end that is soldered, bonded, affixed, or otherwise electrically connected to the drain terminal 364 of amplifier stage 220, and an opposing end that is soldered, bonded, affixed, or otherwise electrically connected to the output package lead 250.

The arrangement depicted in FIGS. 2-4 corresponds to a first embodiment of an amplifier path (e.g., one of amplifier paths 104-106, FIG. 1), which includes an input impedance matching network 210-212 having a low-pass impedance matching circuit topology, and an output impedance matching network 230-232 having a high-pass impedance matching circuit topology. For example, FIG. 5 is a circuit diagram of such an amplifier path 500, in accordance with an example embodiment. Amplifier path 500 includes input impedance matching network 510, an amplifier 520, and output impedance matching network 530.

The input impedance matching network 510 is coupled between an input terminal 502 and a first amplifier terminal 504, and includes a first inductor 512 (e.g., wirebond array 215, FIG. 2), a second inductor 514 (e.g., wirebond array 216, FIG. 2), and a first capacitor 516 (e.g., capacitor 214, FIG. 2). Input impedance matching network 510 is realized as a shunt capacitance impedance matching circuit topology. More specifically, the first inductor 512 has a first terminal coupled to the input terminal 502, and a second terminal coupled to first terminals of each of the second inductor 514 and the first capacitor 516. The second inductor 514 has a second terminal coupled to the first amplifier terminal 504. The first capacitor 516 has a second terminal coupled to a ground reference voltage (e.g., present at conductive substrate 270, FIG. 2).

In an embodiment, the capacitance of the capacitive element 516 and the inductances of the inductive elements 512, 514 are chosen to provide a desired input impedance at the input 502 of the electronic device 500 at the fundamental frequency of the amplifier system. For example, for a fundamental frequency of about 1.8 GHz to about 2.2 GHz with an amplifier 520 with a power handling capability within the range of about 50 W to about 500 W, the capacitance of the capacitive element 516 may be chosen to be within the range of about 15 picoFarads (pF) to about 150 pF, the inductance of the inductive element 512 may be chosen to be within the range of about 100 picoHenrys (pH) to about 400 pH, and the inductance of inductive element 514 may be chosen to be within the range of about 50 pH to about 150 pH, such that each input impedance matching network 510 provides an input impedance at the input 502 of the amplifier path within the range of about one to five ohms. In practice, the input impedance at the input 502 may vary to suit the needs of a particular embodiment.

The amplifier 520 has a gate terminal coupled to the first amplifier terminal 504, a source terminal coupled to a second amplifier terminal 506, and a drain terminal coupled to the ground reference voltage (e.g., present at conductive substrate 270, FIG. 2). The output impedance matching network 530 is coupled between the second amplifier terminal 506 and output terminal 508, and includes a third inductor 532 (e.g., wirebond array 217, FIG. 2), a fourth inductor 534 (e.g., wirebond array 218, FIG. 2), and a second capacitor 536 (e.g., capacitor 234, FIG. 2). Output impedance matching network 530 is realized as a shunt inductance impedance matching circuit topology. More specifically, the third inductor 532 has a first terminal coupled to the second amplifier terminal 506 and to a first terminal of the fourth inductor 534, and a second terminal coupled to a first terminal of second capacitor 536. The fourth inductor 534 has a second terminal coupled to the output terminal 508. The second capacitor 536 has a second terminal coupled to a ground reference voltage (e.g., present at conductive substrate 270, FIG. 2).

In an embodiment, the capacitance of the capacitive element 536 is chosen to provide a virtual ground reference voltage for the RF electrical signals at the output of the amplifier 520 at reference voltage node 538, such that the first inductive element 532 functions as a shunt inductance to the RF ground voltage, while the inductances of the inductive elements 532, 534 are chosen to provide desired impedance at the output 508 of the electronic device 500 at the fundamental frequency of the amplifier system. For example, for a fundamental frequency in the range of about 1.8 GHz to about 2.2 GHz with an amplifier 520 with a power handling capability within the range of about 50 W to about 500 W, the capacitance of the capacitive element 536 may be chosen to be within the range of about 70 pF to about 500 pF, the impedance of the inductive element 534 may be chosen to be within the range of about 100 pH to about 800 pH, and the inductance of the inductive element 534 may be chosen to be within the range of about 100 pH to about 500 pH, such that the amplifier output impedance matching circuitry 530 provides an output impedance at the output 508 of the electronic device 500 within the range of about one to five ohms. It should be appreciated that the desired output impedance at the output 508 may be an intermediate impedance that is subsequently transformed to a different value (e.g., for impedance matching at the input of an external output network 180, FIG. 1), and thus, the output impedance at the output 508 will vary to suit the needs of a particular implementation.

Figure 6:
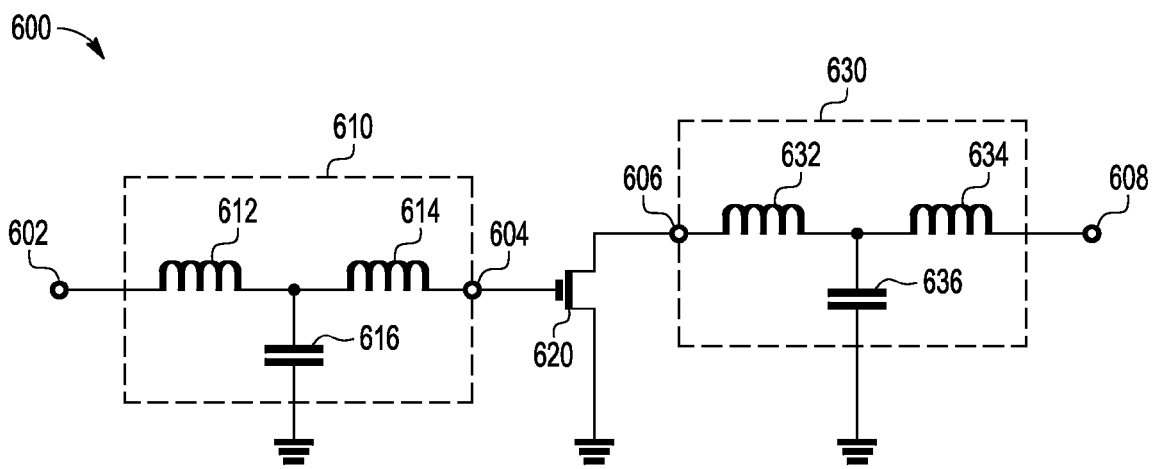
FIG. 6 is a circuit diagram of an amplifier path, in accordance with another example embodiment.

In an alternate embodiment, an amplifier path (e.g., one of amplifier paths 104-106, FIG. 1) may include an input impedance matching network having a low-pass impedance matching circuit topology, and an output impedance matching network also having a low-pass impedance matching circuit topology. For example, FIG. 6 is a circuit diagram of such an amplifier path 600, in accordance with an example embodiment. Amplifier path 600 includes input impedance matching network 610, an amplifier 620, and output impedance matching network 630.

The input impedance matching network 610 is coupled between an input terminal 602 and a first amplifier terminal 604, and includes a first inductor 612 (e.g., wirebond array 215, FIG. 2), a second inductor 614 (e.g., wirebond array 216, FIG. 2), and a first capacitor 616 (e.g., capacitor 214, FIG. 2). Input impedance matching network 610 is realized as a shunt capacitance impedance matching circuit topology. More specifically, the first inductor 612 has a first terminal coupled to the input terminal 602, and a second terminal coupled to first terminals of each of the second inductor 614 and the first capacitor 616. The second inductor 614 has a second terminal coupled to the first amplifier terminal 604. The first capacitor 616 has a second terminal coupled to a ground reference voltage (e.g., present at conductive substrate 270, FIG. 2). The amplifier 620 has a gate terminal coupled to the first amplifier terminal 604, a source terminal coupled to a second amplifier terminal 606, and a drain terminal coupled to the ground reference voltage (e.g., present at conductive substrate 270, FIG. 2).

The output impedance matching network 630 is coupled between the second amplifier terminal 606 and output terminal 608, and includes a third inductor 632 (e.g., wirebond array 217, FIG. 2), a fourth inductor 634 (e.g., wirebond array 218, FIG. 2), and a second capacitor 636 (e.g., capacitor 234, FIG. 2). Output impedance matching network 630 is realized as a shunt inductance impedance matching circuit topology. More specifically, the third inductor 632 has a first terminal coupled to the second amplifier terminal 606, and a second terminal coupled to first terminals of each of the fourth inductor 634 and the second capacitor 636. The fourth inductor 634 has a second terminal coupled to the output terminal 608. The second capacitor 636 has a second terminal coupled to a ground reference voltage (e.g., present at conductive substrate 270, FIG. 2).

In an embodiment, the capacitance of the capacitive element 636 and the inductances of the inductive elements 632, 634 are chosen to provide a desired input impedance at the output 608 of the electronic device 600 at the fundamental frequency of the amplifier system. For example, for a fundamental frequency of about 1.8 GHz to about 2.2 GHz with an amplifier 620 with a power handling capability within the range of about 50 W to about 500 W, the capacitance of the capacitive element 636 may be chosen to be within the range of about 15 pF to about 150 pF, the inductance of the inductive element 632 may be chosen to be within the range of about 100 pH to about 400 pH, and the inductance of inductive element 634 may be chosen to be within the range of about 50 pH to about 150 pH, such that each output impedance matching network 630 provides an output impedance at the output 608 of the amplifier path within the range of about one to five ohms. In practice, the output impedance at the output 608 may vary to suit the needs of a particular embodiment.

In other alternate embodiments, an amplifier path (e.g., one of amplifier paths 104-106, FIG. 1) may include an input impedance matching network having a high-pass impedance matching circuit topology (e.g., a shunt inductance impedance matching circuit topology), and an output impedance matching network having a low-pass or high-pass impedance matching circuit topology (e.g., a shunt capacitance or shunt inductance impedance matching circuit topology). In still other alternate embodiments, the input impedance matching networks for the amplifier paths may include circuit topologies that are different from each other (e.g., a combination of low-pass and high-pass impedance matching circuit topologies), and/or the output impedance matching networks for the amplifier paths may include circuit topologies that are different from each other (e.g., a combination of low-pass and high-pass impedance matching circuit topologies).

Figure 7:
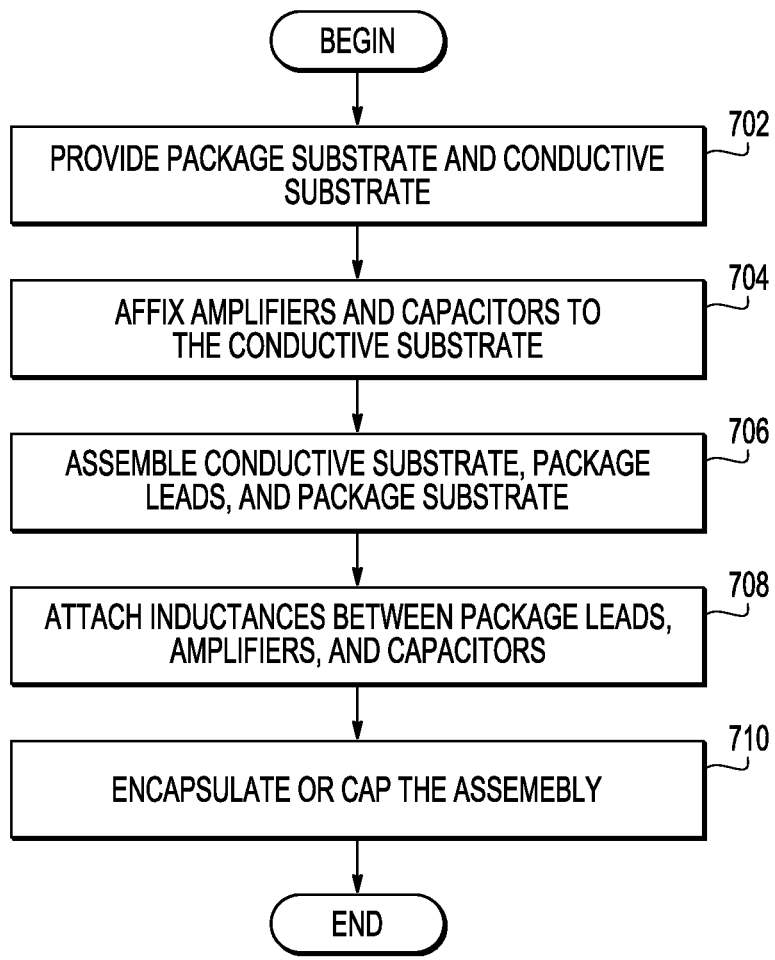
FIG. 7 is a flowchart of a method for manufacturing an electronic device, in accordance with an example embodiment.

FIG. 7 is a flowchart of a method for manufacturing an electronic device (e.g., electronic device 200, FIG. 2), in accordance with an example embodiment. The method begins, in block 702, by providing a package substrate (e.g., package substrate 272, FIG. 2) and a conductive substrate (e.g., conductive substrate 270, FIG. 2). The conductive substrate may be mounted to the package substrate at this stage of manufacture, or may be mounted to the package substrate at a later stage.

In block 704, amplifiers (e.g., amplifier stages 220-222, FIG. 2) and discrete capacitors (e.g., capacitors 214, 234, FIG. 2) are affixed to the conductive substrate. For example, the amplifiers and capacitors may be arranged in a manner similar to that depicted in FIGS. 2-4, although the amplifiers and capacitors may be arranged in other configurations, as well. More particularly, according to an embodiment, first, second, and third amplifier stages are aligned and affixed to a central portion of the conductive substrate, first, second, and third discrete capacitors are affixed to an area of the conductive substrate that will be between the input package leads and the amplifier stages, and fourth, fifth, and sixth discrete capacitors are affixed to a second area of the conductive substrate that will be between the amplifier stages and the output package leads.

In block 706, the conductive substrate and package leads (e.g., package leads 240-242, 250-252, FIG. 2) are assembled with the package substrate (e.g., in a configuration similar to or different from that illustrated in FIGS. 2-4). In block 708, inductances (e.g., wirebond arrays 215-218, FIG. 2) are attached between the package leads, the amplifiers, and the capacitors to complete input and output impedance matching networks (e.g., input and output impedance matching networks 510, 610, 530, 630, FIGS. 5, 6). In block 710, the assembly may then be encapsulated or capped (e.g., with cap 370, FIG. 3) to complete the electronic device. For example, a cap (e.g., cap 370, FIG. 3) may be coupled to a surface of the package substrate to provide an air cavity within which the amplifier paths are disposed. Alternatively, encapsulation may be provided over the surface of the package substrate and the amplifier paths. The method may then end.

For the sake of brevity, conventional techniques related to Doherty amplifiers, load modulation, impedance matching, integrated circuit design and/or fabrication, transistor design and/or fabrication, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

In conclusion, systems, devices, and methods configured in accordance with example embodiments of the invention have been disclosed. An embodiment of an electrical device includes a device package and a plurality of amplifier paths physically contained by the device package. Each amplifier path includes an amplifier stage electrically coupled between an input and an output to the amplifier stage, and the amplifier stages of the plurality of amplifier paths are symmetrical. In a further embodiment, the plurality of amplifier paths have translational symmetry within the device package. In another further embodiment, transistors comprising the amplifier stages of the plurality of amplifier paths are substantially identical in size.

An embodiment of an amplifier system includes an electronic device, an external input network, and an external output network. The electronic device has a device package, three input leads, three output leads, and three amplifier paths physically contained by the device package. Each amplifier path includes an amplifier stage electrically coupled between an input lead and an output lead, and the amplifier stages are symmetrical. The external input network is coupled between the input node and the input leads, and the external output network is coupled between the output leads and the output node.

An embodiment of a method of manufacturing an electronic device includes affixing a plurality of amplifier stages to a first substrate, where the plurality of amplifier stages are symmetrical, and assembling the first substrate with a plurality of input package leads and a plurality of output package leads. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An electrical device comprising:
   a device package that includes a substrate;
   a plurality of amplifier paths physically contained by the device package, wherein each amplifier path includes an input lead that is separate from input leads of other ones of the amplifier paths, an output lead that is separate from output leads of other ones of the amplifier paths, and an amplifier stage that is affixed to the substrate and electrically coupled between the input lead and the output lead, wherein all of the amplifier stages of the plurality of amplifier paths are symmetrical, and each amplifier stage is fabricated on a separate die;
   a plurality of discrete capacitors affixed to the substrate; and
   a plurality of inductive elements coupled between the input package leads, the discrete capacitors, the amplifier stages, and the output package leads to form a plurality of input impedance matching networks and a plurality of output impedance matching networks.

2. The electrical device of claim 1, wherein the plurality of amplifier paths have translational symmetry within the device package.

3. The electrical device of claim 1, wherein transistors comprising the amplifier stages of the plurality of amplifier paths are substantially identical in size.

4. The electrical device of claim 1, wherein the plurality of amplifier paths includes:
   a first amplifier path having a first input, a first output, and a first amplifier stage between the first input and the first output;
   a second amplifier path having a second input, a second output, and a second amplifier stage between the second input and the second output; and
   a third amplifier path having a third input, a third output, and a third amplifier stage between the third input and the third output.

5. An electrical device comprising:
   a device package that includes a substrate; and
   a plurality of amplifier paths physically contained by the device package, wherein each amplifier path includes:
      an input package lead that is separate from input package leads of other ones of the amplifier paths;
      an output package lead that is separate from output package leads of other ones of the amplifier paths;
      an amplifier stage that is affixed to the substrate and electrically coupled between the input package lead and the output package lead;
      at least one discrete capacitor affixed to the substrate; and
      a plurality of inductive elements coupled between the input package lead, the at least one discrete capacitor, the amplifier stage, and the output package lead to form an input impedance matching network coupled between the input package lead and the input to the amplifier stage, and an output impedance matching network coupled between the output to the amplifier stage and the output package lead, and
   wherein input impedance matching networks of the plurality of amplifier paths are substantially identical to each other, and output impedance matching networks of the plurality of amplifier paths are substantially identical to each other, and wherein all of the amplifier stages of the plurality of amplifier paths are symmetrical.

6. The electrical device of claim 5, further comprising:
   a cap that forms a part of the device package and that provides an air cavity within which the amplifier stage of each of the amplifier paths is disposed.

7. The electrical device of claim 5, further comprising:
   encapsulation over the amplifier stage of each of the amplifier paths.

8. The electrical device of claim 5, wherein the amplifier stage of each of the plurality of amplifier paths is provided on a separate die.

9. The electrical device of claim 5, wherein the amplifier stage of each of the plurality of amplifier paths is provided on a single die.

10. An electrical device comprising:
    a device package that includes
       a package substrate having a surface, and
       a conductive substrate coupled to the surface of the package substrate; and
    a plurality of amplifier paths physically contained by the device package, wherein each amplifier path includes an input lead that is separate from input leads of other ones of the amplifier paths, an output lead that is separate from output leads of other ones of the amplifier paths, an amplifier stage that is electrically coupled between the input lead and the output lead, wherein all of the amplifier stages of the plurality of amplifier paths are symmetrical, and wherein the amplifier stage of each of the amplifier paths is coupled to the conductive substrate, at least one discrete capacitor affixed to the substrate, and a plurality of inductive elements attached between the input lead, the at least one discrete capacitor, the amplifier stage, and the output lead to form an input impedance matching network and an output impedance matching network.

11. An amplifier system having an input node and an output node, the amplifier system comprising:
    an electronic device having a device package, a substrate, three input leads, three output leads, and three amplifier paths physically contained by the device package, wherein each amplifier path includes
       an amplifier stage affixed to the substrate and electrically coupled between an input lead and an output lead that are different from the input leads and the output leads to which other ones of the amplifier paths are coupled, and wherein all of the amplifier stages are symmetrical, and each amplifier stage is fabricated on a separate die;
       at least one discrete capacitor affixed to the substrate, and
       a plurality of inductive elements attached between an input package lead, the at least one discrete capacitor, the amplifier stage, and an output package lead to form an input impedance matching network and an output impedance matching network;
    an external input network coupled between the input node and the input leads; and
    an external output network coupled between the output leads and the output node.

12. The amplifier system of claim 11, wherein the amplifier system is configured in a Doherty amplifier circuit topology.

13. The amplifier system of claim 11, wherein:
    the input impedance matching network is coupled between the input lead and an input to the amplifier stage of the amplifier path;
    the output impedance matching network is coupled between an output to the amplifier stage and the output lead of the amplifier path;

input impedance matching networks of the three amplifier paths are substantially identical to each other; and output impedance matching networks of the three amplifier paths are substantially identical to each other.

14. An amplifier system having an input node and an output node, the amplifier system comprising:

an electronic device having a device package, three input leads, three output leads, and three amplifier paths physically contained by the device package, wherein each amplifier path includes an amplifier stage electrically coupled between an input lead and an output lead, and wherein the amplifier stages are symmetrical;

an external input network coupled between the input node and the input leads, wherein the external input network comprises:
a power splitter coupled to the input node and configured to divide input power of an input signal received at the input node into three portions of the input signal, wherein each of the three portions is provided at one of three outputs of the power splitter,
a first phase inversion element coupled between a first output of the power splitter and a first input lead of a first amplifier path, wherein a second output of the power splitter is coupled to a second input lead of a second amplifier path, and
a second phase inversion element coupled between a third output of the power splitter and a third input lead of a third amplifier path; and an external output network coupled between the output leads and the output node.

15. An amplifier system having an input node and an output node, the amplifier system comprising:

an electronic device having a device package, three input leads, three output leads, and three amplifier paths physically contained by the device package, wherein each amplifier path includes an amplifier stage electrically coupled between an input lead and an output lead, and wherein the amplifier stages are symmetrical;

an external input network coupled between the input node and the input leads; and an external output network coupled between the output leads and the output node, wherein the external output network comprises:
a first summing node coupled to the output node,
a second summing node,
a first phase inversion element coupled between a first output lead of a first amplifier path and the first summing node,
a second phase inversion element coupled between a second output lead of a second amplifier path and the second summing node, wherein a third output lead of a third amplifier path is coupled to the second summing node, and
a third phase inversion element coupled between the second summing node and the first summing node.

16. A method of manufacturing an electronic device comprising:

affixing a plurality of amplifier stages to a first substrate, wherein the plurality of amplifier stages are symmetrical, each amplifier stage is fabricated on a separate die, and each amplifier stage corresponds to a different one of a plurality of amplifier paths;

assembling the first substrate with a plurality of input package leads and a plurality of output package leads, wherein the plurality of input package leads includes an input package lead for each of the plurality of amplifier paths that is separate from input package leads of other ones of the amplifier paths, and wherein the plurality of output package leads includes an output package lead for each of the plurality of amplifier paths that is separate from output package leads of other ones of the amplifier paths;

affixing a plurality of discrete capacitors to the first substrate; and attaching a plurality of inductive elements between the input package leads, the discrete capacitors, the amplifier stages, and the output package leads to form a plurality of input impedance matching networks and a plurality of output impedance matching networks.

17. The method of claim 16, further comprising:
providing a cap over the plurality of amplifier stages.

18. The method of claim 16, further comprising:
encapsulating the plurality of amplifier stages.

19. A method of manufacturing an electronic device comprising:

assembling a first substrate with a plurality of input package leads and a plurality of output package leads, wherein each input package lead and each output package lead corresponds to a different one of a plurality of amplifier paths;

affixing a plurality of amplifier stages to the first substrate, wherein the plurality of amplifier stages are symmetrical, and each of the plurality of amplifier stages corresponds to a different one of the plurality of amplifier paths, and affixing the plurality of amplifier stages to the first substrate comprises affixing three amplifier stages to the first substrate, wherein each of the three amplifier stages is provided on a separate die block;

affixing a plurality of discrete capacitors to the first substrate, wherein affixing the plurality of discrete capacitors to the first substrate comprises affixing six discrete capacitors to the first substrate, wherein first, second, and third ones of the discrete capacitors are affixed to an area of the first substrate between the input package leads and the plurality of amplifier stages, and fourth, fifth, and sixth ones of the discrete capacitors are affixed to a second area of the first substrate between the plurality of amplifier stages and the output package leads; and attaching a plurality of inductive elements between the input package leads, the discrete capacitors, the amplifier stages, and the output package leads to form a plurality of input impedance matching networks and a plurality of output impedance matching networks, wherein attaching the plurality of inductive elements comprises attaching a plurality of wirebond arrays between the input package leads, the discrete capacitors, the discrete amplifier stages, and the output package leads.

* * * * *